US010701824B2

(12) United States Patent
Chao et al.

(10) Patent No.: US 10,701,824 B2
(45) Date of Patent: Jun. 30, 2020

(54) BENDING MODULE AND FOLDING DISPLAY DEVICE

(71) Applicants: Kai-Cheng Chao, Taipei (TW); You-Yu Chen, Taipei (TW); Chia-Hao Hsu, Taipei (TW); Chia-Huang Chan, Taipei (TW)

(72) Inventors: Kai-Cheng Chao, Taipei (TW); You-Yu Chen, Taipei (TW); Chia-Hao Hsu, Taipei (TW); Chia-Huang Chan, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/407,189

(22) Filed: May 9, 2019

(65) Prior Publication Data

US 2019/0350096 A1    Nov. 14, 2019

Related U.S. Application Data

(60) Provisional application No. 62/669,339, filed on May 9, 2018.

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC combination set(s) only.
See application file for complete search history.

(56) References Cited

U.S. PATENT DOCUMENTS

| 8,804,349 | B2* | 8/2014 | Lee | G06F 1/1641 |
| | | | | 361/749 |
| 9,173,288 | B1* | 10/2015 | Kim | G06F 1/1633 |
| 9,179,559 | B1* | 11/2015 | Kim | G06F 1/1616 |
| 9,235,239 | B2* | 1/2016 | van Dijk | G06F 1/1652 |
| 9,572,272 | B2* | 2/2017 | Lee | H04M 1/0216 |

(Continued)

FOREIGN PATENT DOCUMENTS

| CN | 103778858 | 5/2014 |
| TW | 201610643 | 3/2016 |

OTHER PUBLICATIONS

"Office Action of Taiwan Counterpart Application", dated Apr. 22, 2020, p. 1-p. 7.

*Primary Examiner* — Lisa Lea-Edmonds
(74) *Attorney, Agent, or Firm* — JCIPRNET (57) ABSTRACT

A bending module and a folding display device are provided. The bending module is adapted to vary between a flattened state and a bent state. The bending module includes a flexible unit and a pair of supporting members. The flexible unit has a neutral layer, and the pair of supporting members are connected to the flexible unit. When the bending module varies between the flattened state and the bent state, the flexible unit is deformed, and the supporting members are each rotated via one corresponding center of rotation to be relatively close to or far from each other, wherein the centers of rotation are always maintained on the neutral layer of the flexible unit. By applying the bending module to the folding display device, the service life of the folding display device may be extended.

12 Claims, 9 Drawing Sheets

(56) References Cited

U.S. PATENT DOCUMENTS

| | | | |
|---|---|---|---|
| 9,603,271 B2* | 3/2017 | Lee | H05K 5/0017 |
| 9,980,373 B2* | 5/2018 | Jeong | G05B 11/01 |
| 10,043,421 B2* | 8/2018 | Koo | G06F 1/1626 |
| 10,104,790 B2* | 10/2018 | Lee | E05D 11/0054 |
| 10,398,048 B2* | 8/2019 | Jeon | H05K 5/0017 |
| 2012/0033354 A1* | 2/2012 | Huang | G09F 9/33 |
| | | | 361/679.01 |
| 2012/0314399 A1* | 12/2012 | Bohn | G06F 1/1616 |
| | | | 362/97.1 |
| 2016/0143162 A1* | 5/2016 | Van Dijk | G06F 1/1652 |
| | | | 361/679.01 |
| 2017/0374749 A1 | 12/2017 | Lee et al. | |
| 2018/0160553 A1* | 6/2018 | Yeh | H05K 5/0017 |
| 2018/0242466 A1* | 8/2018 | Lee | G09F 9/301 |
| 2018/0343756 A1* | 11/2018 | Lin | H05K 5/0017 |
| 2019/0021179 A1* | 1/2019 | Cheng | H05K 5/0226 |
| 2019/0174645 A1* | 6/2019 | Jeon | H05K 5/0017 |

* cited by examiner

BENDING MODULE AND FOLDING DISPLAY DEVICE

CROSS-REFERENCE TO RELATED APPLICATION

This application claims the priority benefit of U.S. provisional application Ser. No. 62/669,339, filed on May 9, 2018. The entirety of the above-mentioned patent application is hereby incorporated by reference herein and made a part of this specification.

BACKGROUND OF THE INVENTION

Field of the Invention

The invention relates to a module and a device, and in particular to a bending module and a folding display device.

Description of Related Art

In recent years, flexible display technology has matured, and various manufacturers have begun to apply flexible display panels to various products. A display device using a flexible display panel may realize a large screen when unfolded and is easy to carry when bent, and thus is suitable for displays in various fields such as televisions, monitors, portable phones, ultra-thin portable personal computers, e-books, and electronic papers.

Specifically, when a user wants to use the folding display device, it may be unfolded to fully unfold the flexible display screen such that a larger display image may be obtained. When the user wants to move the folding display device, the folding display device may be folded to reduce the size of the folding display device for carrying.

In general, although the folding display device may reduce the size of the product when folded, the flexible display screen of the folding display device is also folded together. This may cause the supporting members attached to the outside of the flexible display screen to pull the flexible display screen, which in turn damages the flexible display screen. Therefore, how to prevent the issue of the flexible display screen of the folding display device being pulled by the supporting members is an urgent topic for those skilled in the art.

SUMMARY OF THE INVENTION

The invention provides a bending module in which supporting members are always maintained at fixed positions on a flexible unit during the opening and closing process.

The invention provides a folding display device with a longer service life.

A bending module of the invention is adapted to vary between a flattened state and a bent state. The bending module includes a flexible unit and a pair of supporting members. The flexible unit has a neutral layer, and the pair of supporting members are connected to the flexible unit. When the bending module varies between the flattened state and the bent state, the flexible unit is deformed, and the supporting members are each rotated via one corresponding center of rotation to be relatively close to or far from each other, wherein the centers of rotation are always maintained on the neutral layer of the flexible unit.

In an embodiment of the invention, the flexible unit has a first portion and two second portions located at two sides of the first portion, the supporting members are correspondingly connected to the second portions, and the neutral layer is extended in the first portion and the second portions.

In an embodiment of the invention, positions of the centers of rotation are intersections of each of an extended surface of the neutral layer of the second portions of the flexible unit when the bending module is bent and an extended surface of the neutral layer of the flexible unit when the bending module is flattened.

In an embodiment of the invention, when the bending module is in the flattened state, a distance of the two supporting members connected to two endpoints of the flexible unit is $\pi R$, and R is a bending diameter of the first portion.

A folding display device of the invention includes a bending module and a plurality of rotating shafts. The bending module includes a flexible unit and a pair of supporting members. The flexible unit has a neutral layer, the supporting members are correspondingly connected to the flexible unit, and the rotating shafts are connected in pairs between the supporting members such that the supporting members may be moved synchronously, wherein when the folding display device varies between a flattened state and a bent state, the flexible unit is deformed such that the supporting members respectively correspond to one of centers of rotation and are rotated with respect to the rotating shafts to be relatively close to or far from each other, and the centers of rotation are always maintained on the neutral layer of the flexible unit.

In an embodiment of the invention, the flexible unit is a flexible screen.

In an embodiment of the invention, the flexible unit has a first portion and two second portions located at two sides of the first portion, the supporting members are correspondingly connected to the second portions, and the neutral layer is extended in the first portion and the second portions.

In an embodiment of the invention, each of the supporting members includes a connecting block and a board, and the connecting block has a curved groove portion and a connecting portion, wherein the curved groove portion is used to accommodate the rotating shafts; and the second portions of the flexible screen and the connecting portion of the connecting block are attached to two opposite sides of the board.

In an embodiment of the invention, the rotating shafts are gears and teeth are provided inside the curved groove portion, and two gears located at opposite outer sides are engaged with the teeth inside the curved groove portion.

In an embodiment of the invention, when the folding display device is in the flattened state, a distance of the boards connected to two endpoints of the flexible unit is $\pi R$, and R is a bending diameter of the first portion.

In an embodiment of the invention, positions of the centers of rotation are intersections of each of an extended surface of the neutral layer of the second portions of the flexible unit when the bending module is bent and an extended surface of the neutral layer of the flexible unit when the bending module is flattened.

In an embodiment of the invention, the folding display device further includes a housing that shields at least the rotating shafts and the first portion, wherein the supporting members are rotatable with respect to the housing.

Based on the above, by designing the centers of rotation of the supporting members rotating with respect to the flexible unit to be always maintained on the neutral layer, the support members may be prevented from pulling the flexible unit when the bending module is varied between the flattened state and the bent state. When the bending module is applied to the folding display device, the service life of the folding display device may be extended.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
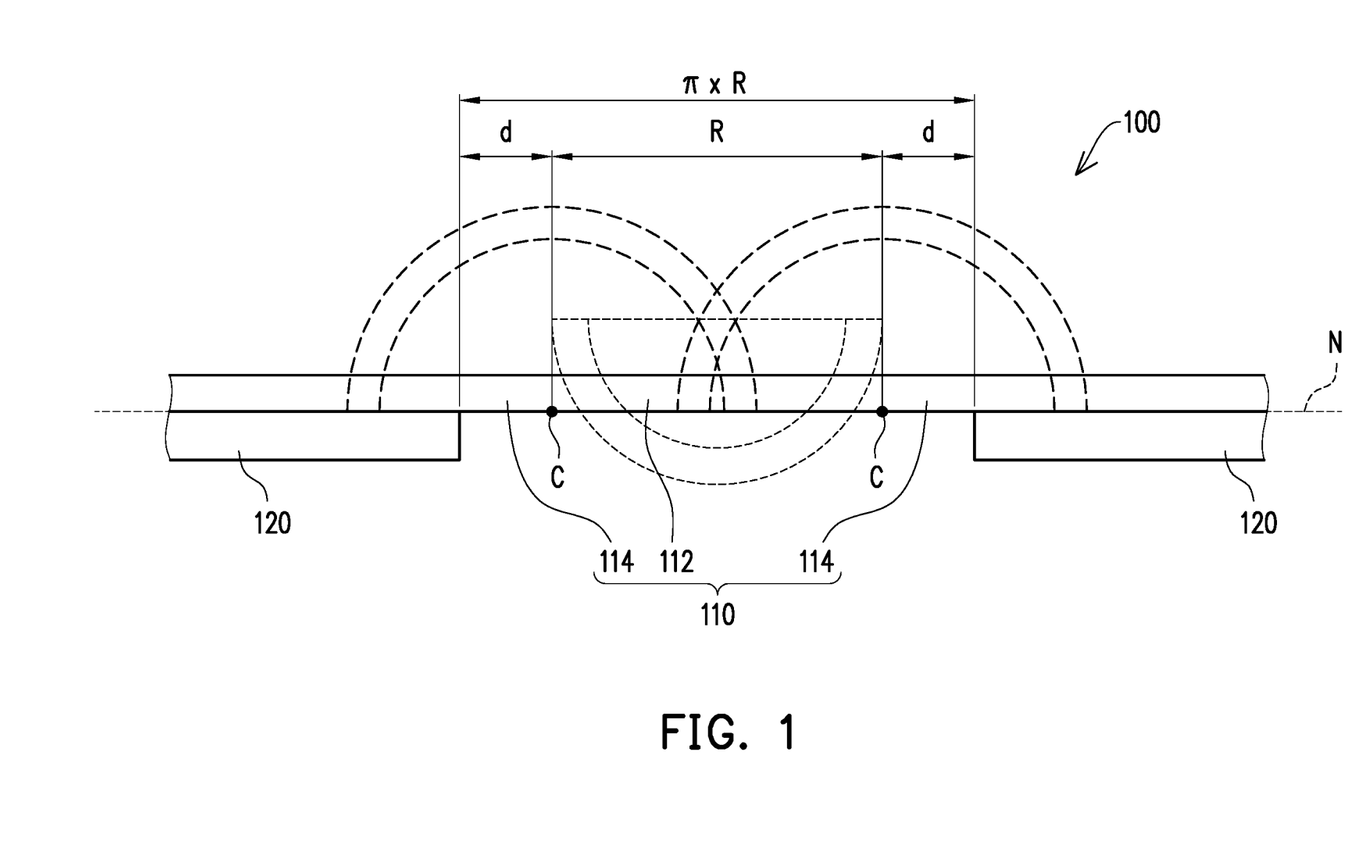
FIG. 1 is a schematic of a bending module in a flattened state of an embodiment of the invention.
Figure 2:
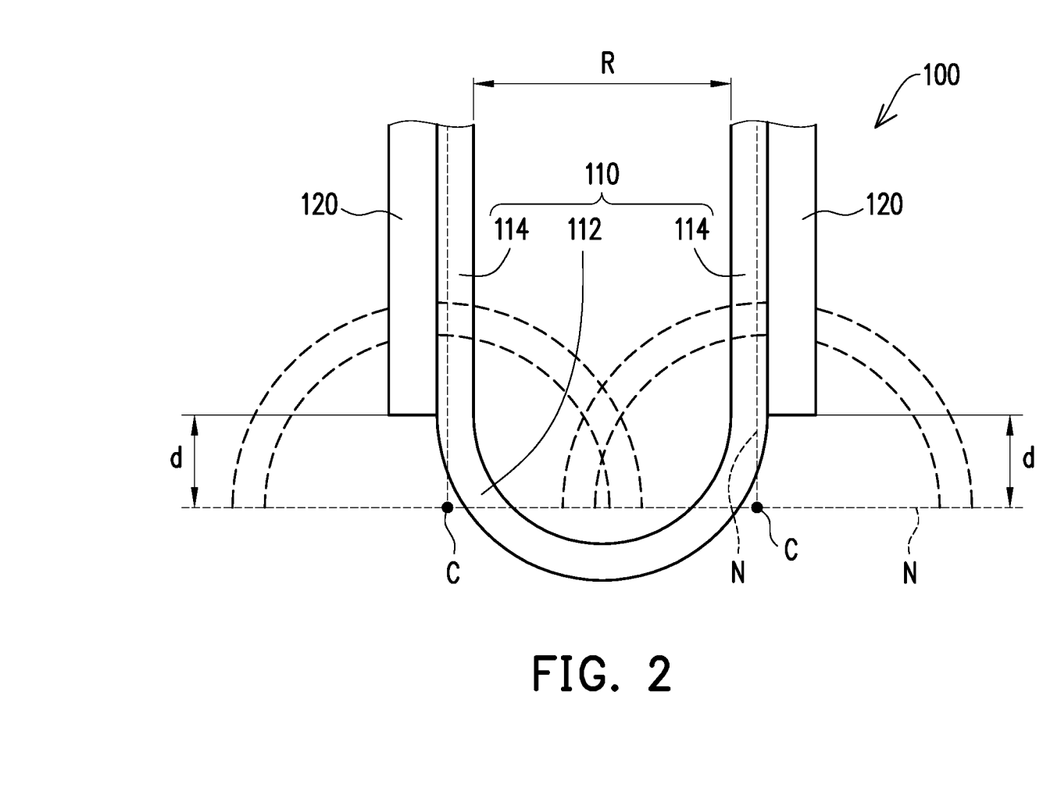
FIG. 2 is a schematic of the bending module of FIG. 1 in a bent state.

FIG. 1 is a schematic of a bending module in a flattened state of an embodiment of the invention, and FIG. 2 is a schematic of the bending module of FIG. 1 in a bent state. Referring to FIG. 1 and FIG. 2 simultaneously, a bending module 100 of the invention includes a flexible unit 110 and a pair of supporting members 120, wherein the flexible unit 110 has a neutral layer N, the pair of supporting members 120 are correspondingly connected to the flexible unit 110, and when the bending module 100 varies between a flattened state and a bent state, the flexible unit 110 is deformed such that the supporting members 120 are each rotated via one corresponding center of rotation C to be relatively close to or far from each other, wherein the centers of rotation C are always maintained on the neutral layer N of the flexible unit 110.

The neutral layer N entails that during the bending process of the material, the outer layer is stretched, the inner layer is compressed, a transition layer is required on the cross section of the material that is not stretched or compressed, and the stress is almost equal to zero. This transition layer is called the neutral layer N of the material. Simply put, the length of the neutral layer N during the bending process remains the same as before the bending and remains unchanged. The neutral layer N does not refer to the layer of the flexible unit 110 at a certain height on the cross section. The neutral layer N is at different heights on the cross section of the flexible unit 110 according to factors such as the material selected for the flexible unit 110 and the implementing thickness thereof. In other words, the neutral layer N may be located on the surface of the flexible unit 110 or located inside the flexible unit 110. For example, if the surface of the flexible unit 110 is also attached with other more rigid materials, such as a bendable glass or metal material for protecting the surface of the flexible unit 110, then the material and the flexible unit 110 are regarded as a whole, and the neutral layer N may be located on the surface of the entirety containing the material and the flexible unit 110.

Based on the above, the flexible unit 110 of the invention has a first portion 112 and two second portions 114 located at two sides of the first portion 112, wherein the supporting members 120 are correspondingly connected to the second portions 114, and the neutral layer N is extended in the first portion 112 and the second portions 114. It should be mentioned that, although the endpoints of the supporting members 120 are schematically located at the edge of the second portions 114 in FIG. 1 and FIG. 2, in practice, the supporting members 120 may further be extended into the second portions 114, or may be extended in a direction toward the first portion 112 and away from the second portions 114.

In the present embodiment, when the bending module 100 is in the flattened state, the distance between the two centers of rotation C is less than or equal to the bending diameter of the first portion 112, the distance of the endpoints between the supporting members 120 is πR, and R is the bending diameter of the first portion 112.

When the bending module 100 is gradually changed from the flattened state of FIG. 1 to the bent state of FIG. 2, the first portion 112 of the flexible unit 110 is bent and deformed into an arc shape, and the two second portions 114 located at two sides of the first portion 112 are each rotated around the respective corresponding center of rotation C located on the neutral layer N with the deformation of the first portion 112 to be gradually close to each other.

In particular, by defining the centers of rotation C of the second portions 114 on the neutral layer N for rotation, whether the bending module 100 is in the flattened state or in the bent state, a distance d of the supporting members 120 connected to the endpoints of the flexible unit 110 to the centers of rotation C adjacent thereto does not change. The distance d of the endpoints of the supporting members 120 to the centers of rotation C adjacent thereto being unchanged means that when the bending module 100 varies between the flattened state and the bent state, the distance d of the endpoints of the supporting members 120 to the centers of rotation C in the flattened state is the same regardless of the angle that the supporting members 120 are rotated with respect to the centers of rotation C.

Specifically, the individual positions of the two centers of rotation C are the intersections of the extended surface of the neutral layer of the second portions 114 of the flexible unit 110 when the bending module 100 is bent and the extended surface of the neutral layer of the flexible unit 110 when the bending module 100 is flattened.

It may be known from the above that when the bending module 100 is bent, the centers of rotation C are always maintained on the neutral layer N of the flexible unit 110, such that the supporting members 120 do not pull the surface of the flexible unit 110 when rotated with respect to the first portion 112 of the flexible unit 110 with the second portions 114 of the flexible unit 110 due to the deformation of the flexible unit 110.

Therefore, even if the bending module 100 varies multiple times between the bent state and the flattened state, the flexible unit 110 is still not damaged due to the change in state.

By applying the bending module 100 to a folding display device 200, since the centers of rotation C are always maintained on the neutral layer N when the bending module 100 is bent, the supporting members 120 do not pull the surface of the flexible unit 110 due to the deformation of the flexible unit 110, such that damage to the flexible screen (corresponding to the flexible unit 110 of the bending module 100) of the folding display device 200 from repeated folding may be prevented.

Figure 3:
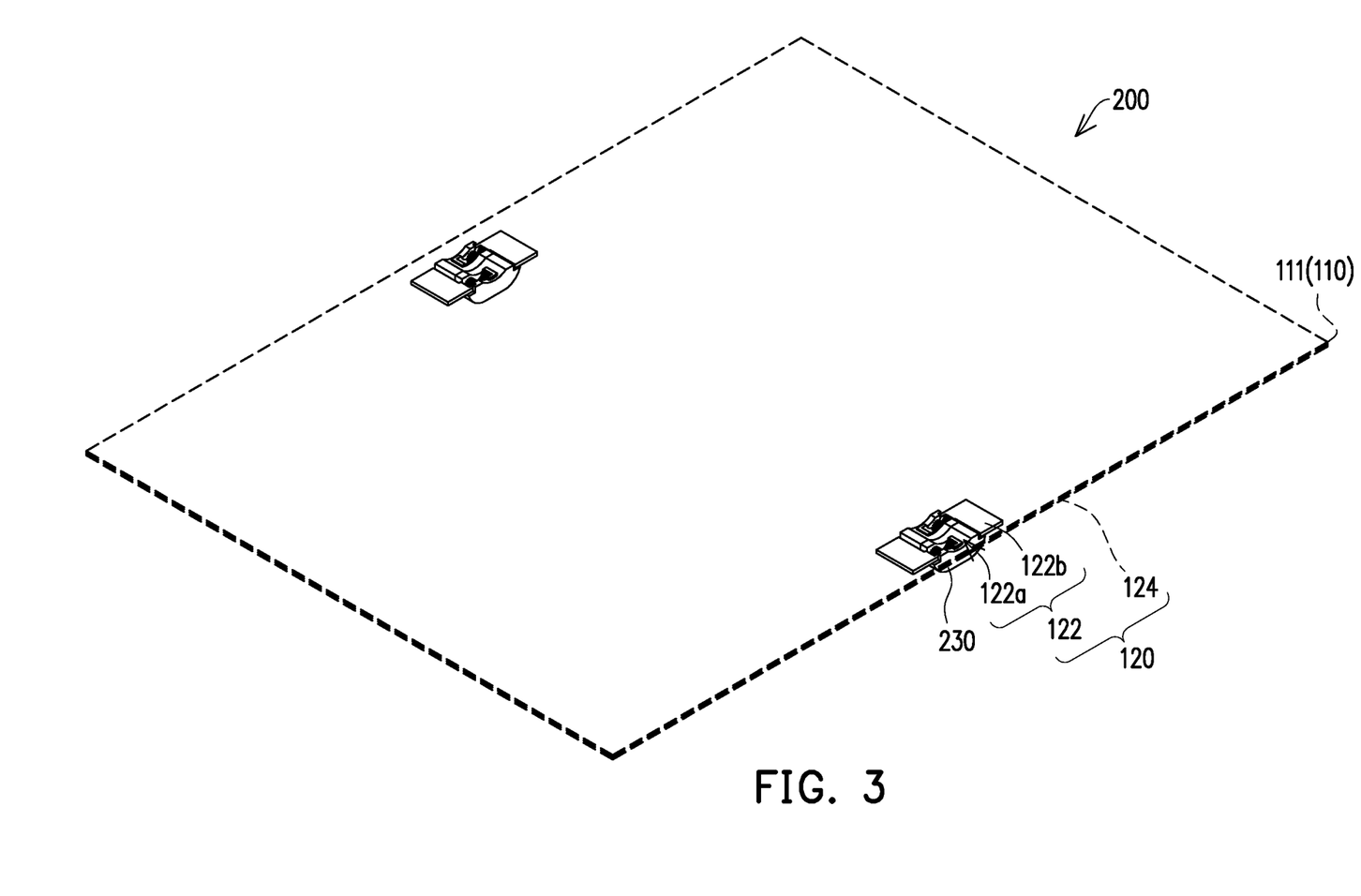
FIG. 3 is a schematic of the flattened state of a folding display device using the bending module of FIG. 1.
Figure 4:
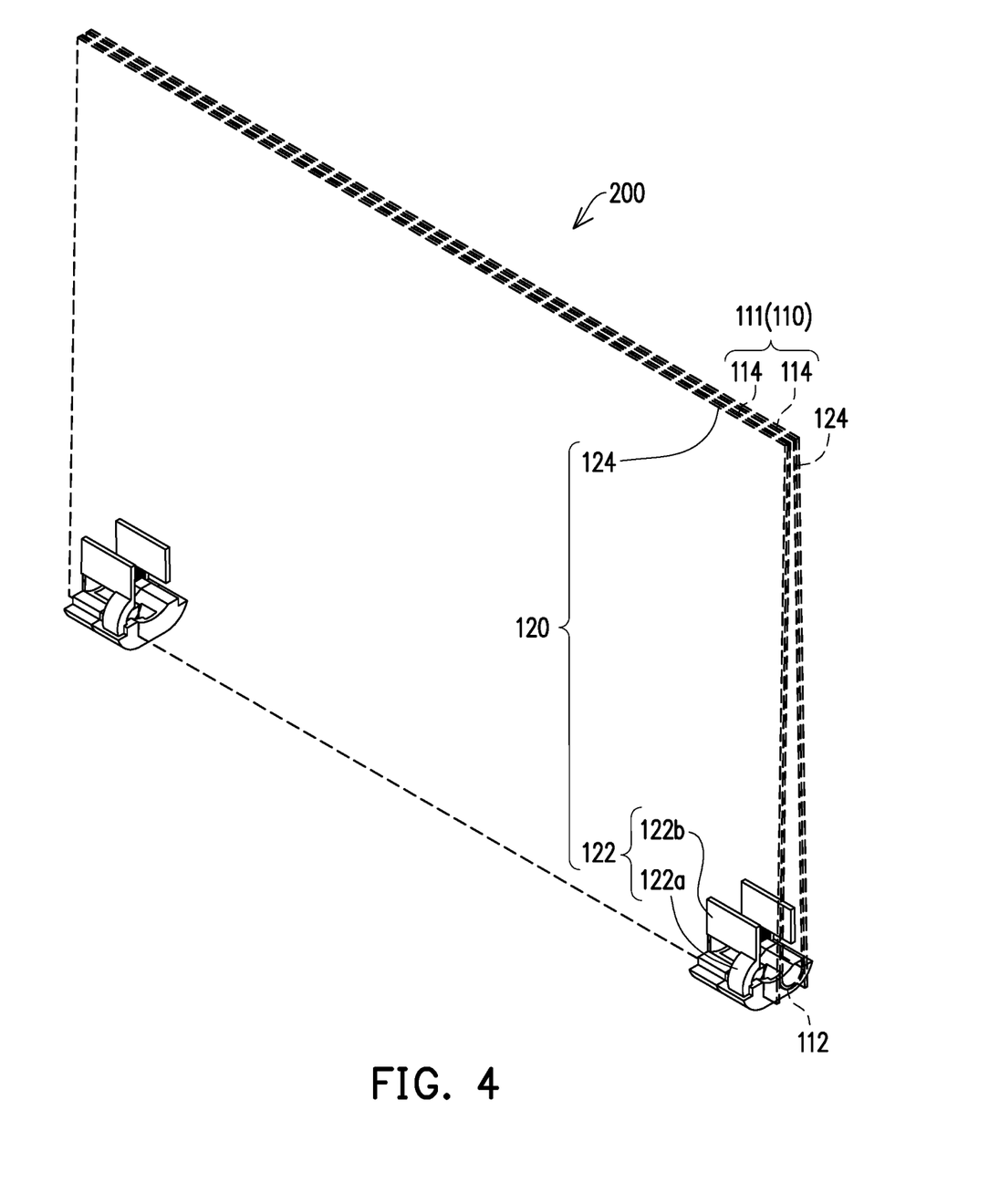
FIG. 4 is a schematic of the bent state of the folding display device of FIG. 3.
Figure 5:
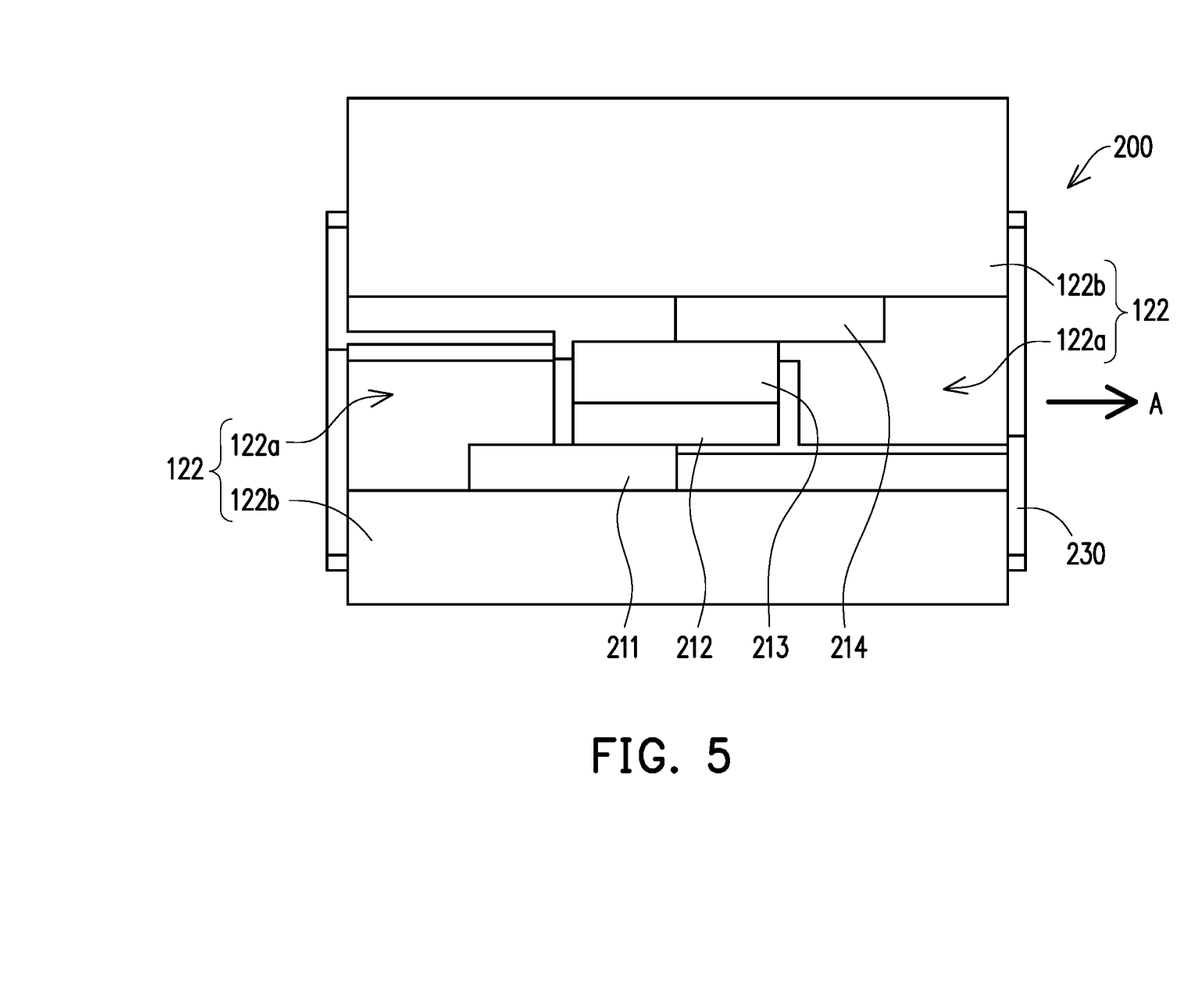
FIG. 5 is a partial schematic of a folding display device using the bending module of FIG. 1.

FIG. 3 is a schematic of the flattened state of a folding display device using the bending module of FIG. 1, and FIG. 4 is a schematic of the bent state of the folding display device of FIG. 3. FIG. 5 is a partial schematic of a folding display device using the bending module of FIG. 1, and FIG. 6 is a schematic of another perspective of the folding display device of FIG. 5.

Referring to FIG. 3, FIG. 4 and FIG. 5 simultaneously, the folding display device 200 of the invention includes the bending module 100 and a plurality of rotating shafts 211, 212, 213, and 214, wherein the flexible unit 110 is implemented by a flexible screen 111, the flexible screen 111 has the neutral layer N, the supporting members 120 are correspondingly connected to the flexible screen 111, and the rotating shafts 211, 212, 213, and 214 are connected in pairs between the supporting members 120, such that when the flexible screen 111 is bent, the two supporting members 120 may be synchronously moved by the rotating shafts 211, 212, 213, and 214.

Figure 6:
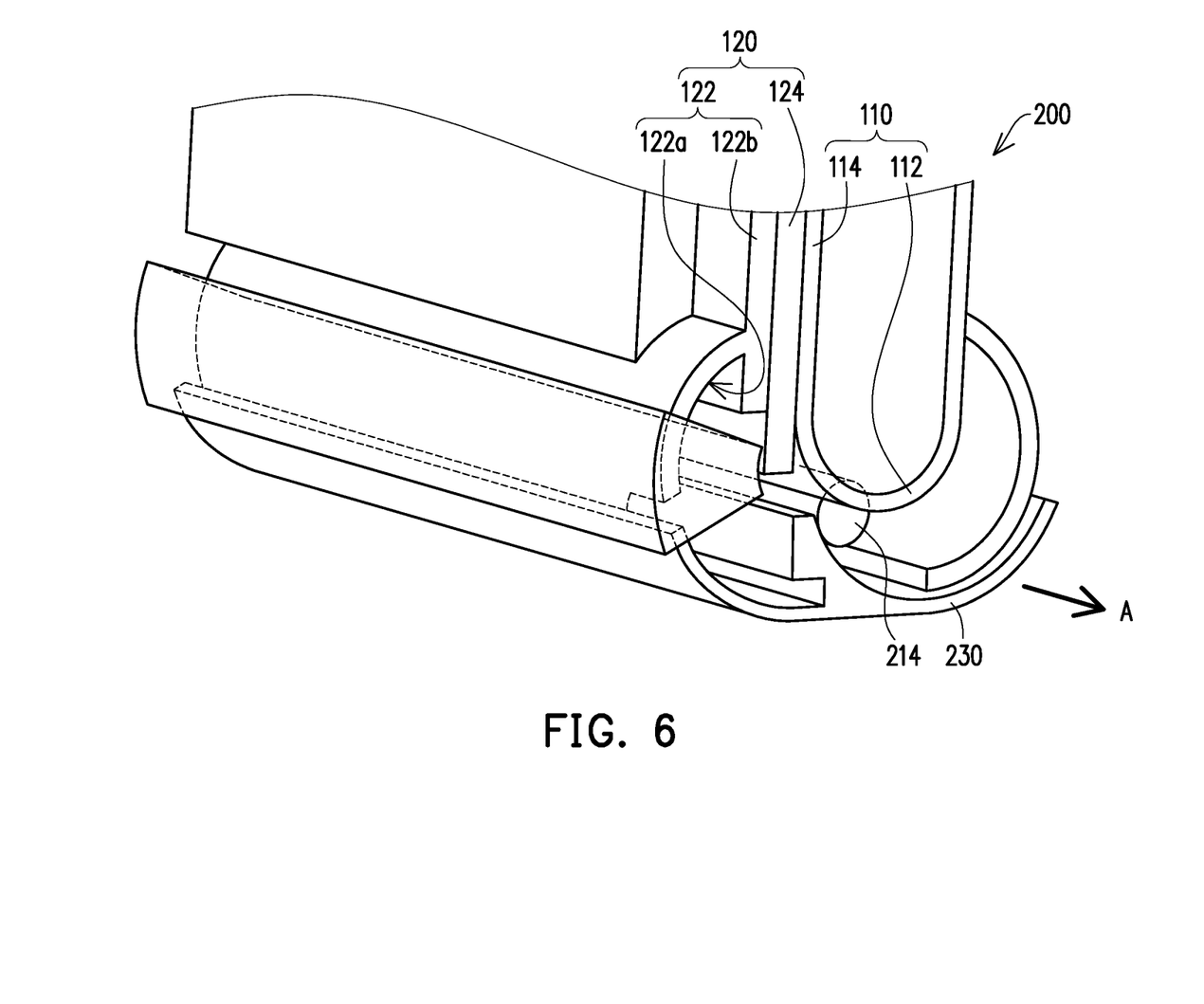
FIG. 6 is a schematic of another perspective of the folding display device of FIG. 5.
Figure 7:
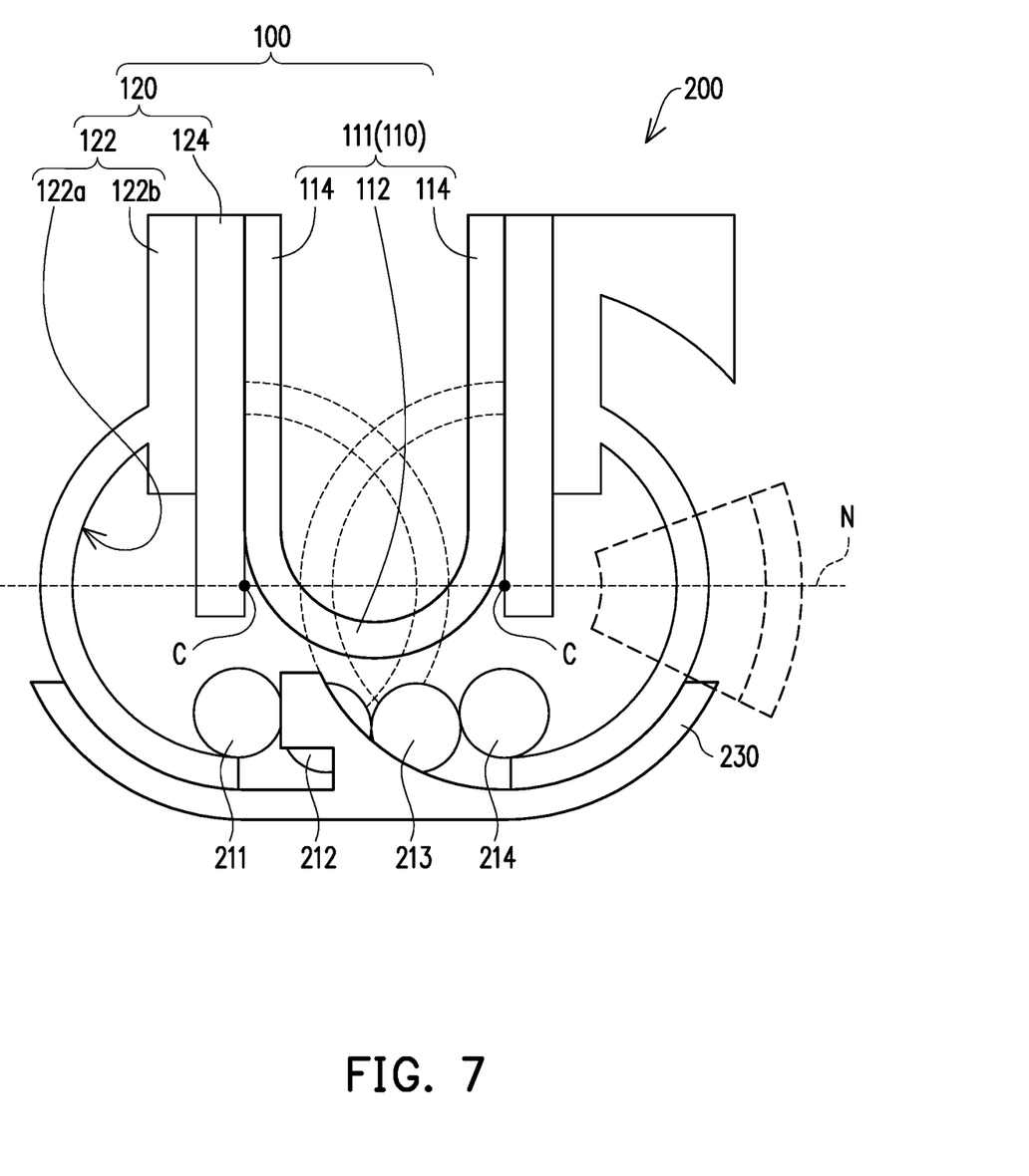
FIG. 7 is a cross section of FIG. 6.

FIG. 7 is a cross section of FIG. 6. Referring to FIG. 5, FIG. 6 and FIG. 7 at the same time, specifically, each of the supporting members 120 may be implemented by a connecting block 122 and a board 124 connected together, wherein the second portions 114 of the flexible screen 111 are attached to the board 124, and the connecting block 122 may have a curved groove portion 122a accommodating the rotating shafts 211, 212, 213, and 214 and a connecting portion 122b connected to the board 124. The four rotating shafts 211, 212, 213, and 214 are used in the folding display device 200 of the present embodiment, and the four rotating shafts 211, 212, 213, and 214 are arranged side by side and parallel to each other without overlapping along an axial direction A. Among the four rotating shafts 211, 212, 213, and 214, the two rotating shafts 211, 214 located at opposite outer sides are respectively protruded toward two opposite directions along the axial direction A. That is, as illustrated in FIG. 5, the rotating shaft 211 located below is protruded more toward the left than the two rotating shafts 212 and 213 located at opposite inner sides, and the rotating shaft 214 located above is protruded more to the right than the two rotating shafts 212 and 213 located at opposite inner sides. Those having ordinary skill in the art should be aware that descriptions of orientations, directions, etc. such as top, bottom, left, right, inside, and outside in the specification are not limited by the foregoing description. When the comparison criteria are changed, the foregoing description follows.

Referring further to FIG. 4, FIG. 5 and FIG. 6 at the same time, the curved groove portion 122a is staggered in the axial direction A of the rotating shafts 211, 212, 213, and 214, and the two rotating shafts 211 and 214 respectively protruded toward two opposite directions along the axial direction A are respectively disposed in the corresponding curved groove portion 122a, and via the matching shapes of the rotating shafts 211 and 214 and the curved groove portion 122a and the configurations of the rotating shafts 211 and 214 and the curved groove portion 122a, the rotating shafts 211 and 214 and the curved groove portion 122a may be rotated with respect to each other such that the folding display device 200 may be changed between the bent state of FIG. 4 and the flattened state of FIG. 3.

In addition, the folding display device 200 further includes a housing 230 that shields at least the rotating shafts 211, 212, 213, and 214 and the first portion 112, wherein the two rotating shafts 212 and 213 located in the middle and the housing 230 are fixed to each other, and when the folding display device 200 is changed from the flattened state to the bent state, the two supporting members 120 may be synchronously rotated via the relative motion between the curved groove portion 122a and the two rotating shafts 211 and 214 located at opposite outer sides.

Figure 8:
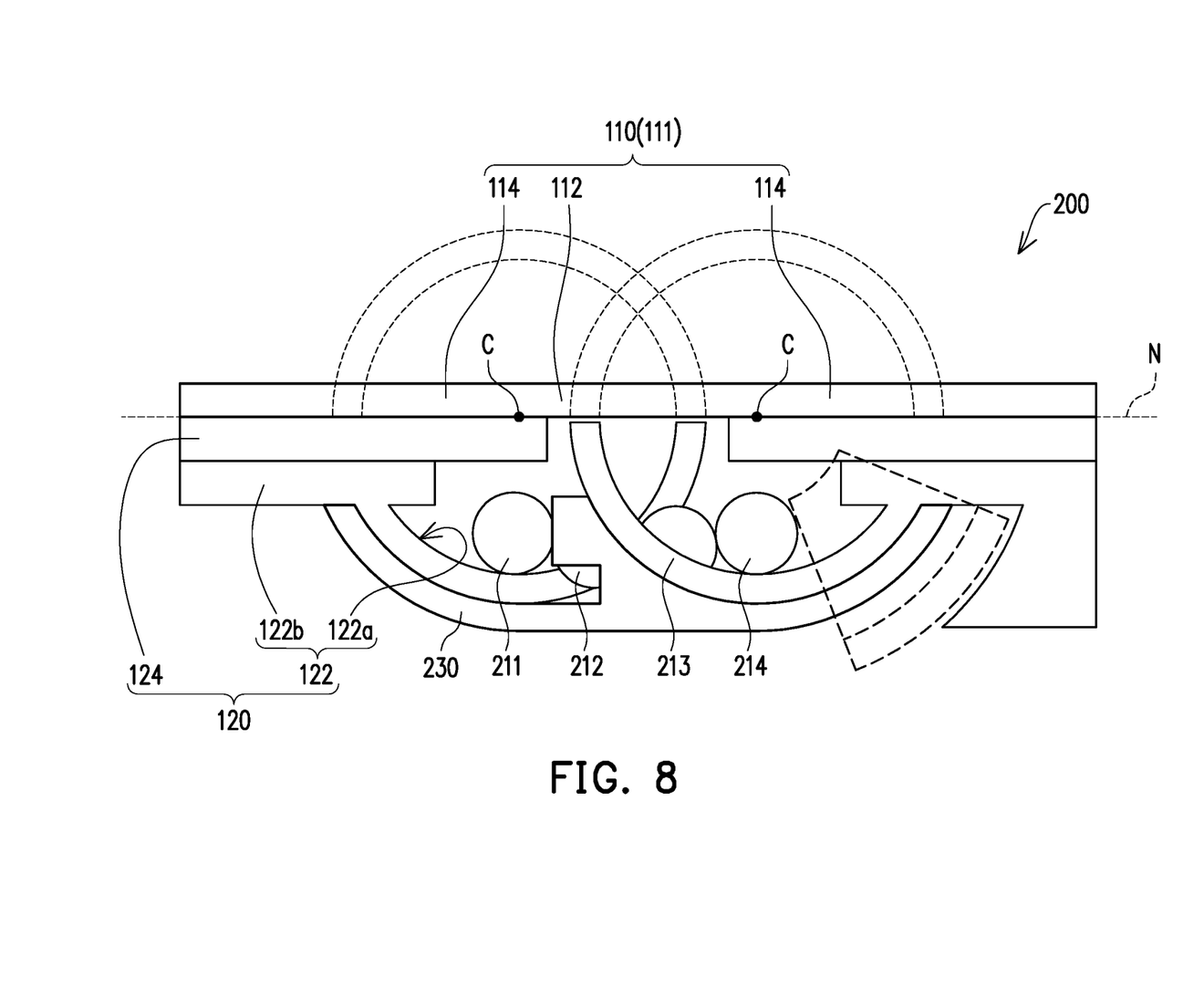
FIG. 8 is a schematic of the folding display device of FIG. 3 in the flattened state.

FIG. 8 is a schematic of the folding display device of FIG. 3 in the flattened state. Referring to FIG. 8, when the folding display device 200 is in the flattened state, the distance of the two boards 124 respectively attached to the endpoints of the second portions 114 of the flexible screen 111 is πR, wherein R is a bend diameter of the first portion 112 of the flexible screen 111. The individual positions of the two centers of rotation C are the intersections of the extended surface of the neutral layer of the second portions 114 of the flexible unit 110 when the bending module 100 is bent and the extended surface of the neutral layer of the flexible unit 110 when the bending module 100 is flattened.

Specifically, when the folding display device 200 is bent from the flattened state to the bent state, the user may grasp the boards 124 and make the two boards 124 relatively close to each other by deforming the first portion 112 of the flexible screen 111 into an arc shape, and at this time, the connecting portion 122b connected to the boards 124 is driven by the boards 124 to cause the curved groove portion 122a and the rotating shafts 211 and 214 to be rotated with respect to each other.

As previously mentioned, the centers of rotation C on which the second portions 114 of the flexible screen 111 attached to the board 124 depend to be rotated are always maintained on the neutral layer N of the flexible screen 111, and therefore the distance d of the board 124 connected to the endpoints of the flexible screen 111 when the folding display device 200 is in the bent state to the positions of the centers of rotation C in the flattened state is the same as the distance d of the board 124 connected to the endpoints of the flexible screen 111 when the folding display device 200 is in the flattened state to the positions of the centers of rotation C as shown in FIG. 1 and FIG. 2. Therefore, regardless of the angle that the board 124 is rotated with respect to the centers of rotation C, the board 124 does not pull the surface of the flexible screen 111 due to the deformation of the first portion 112 of the flexible screen 111.

It may be seen that even if the folding display device 200 undergoes a very large number of transitions between the flattened and bent states, the board 124 does not pull the surface of the flexible screen 111, such that the appearance and functional integrity of the flexible screen 111 may be maintained.

Figure 9:
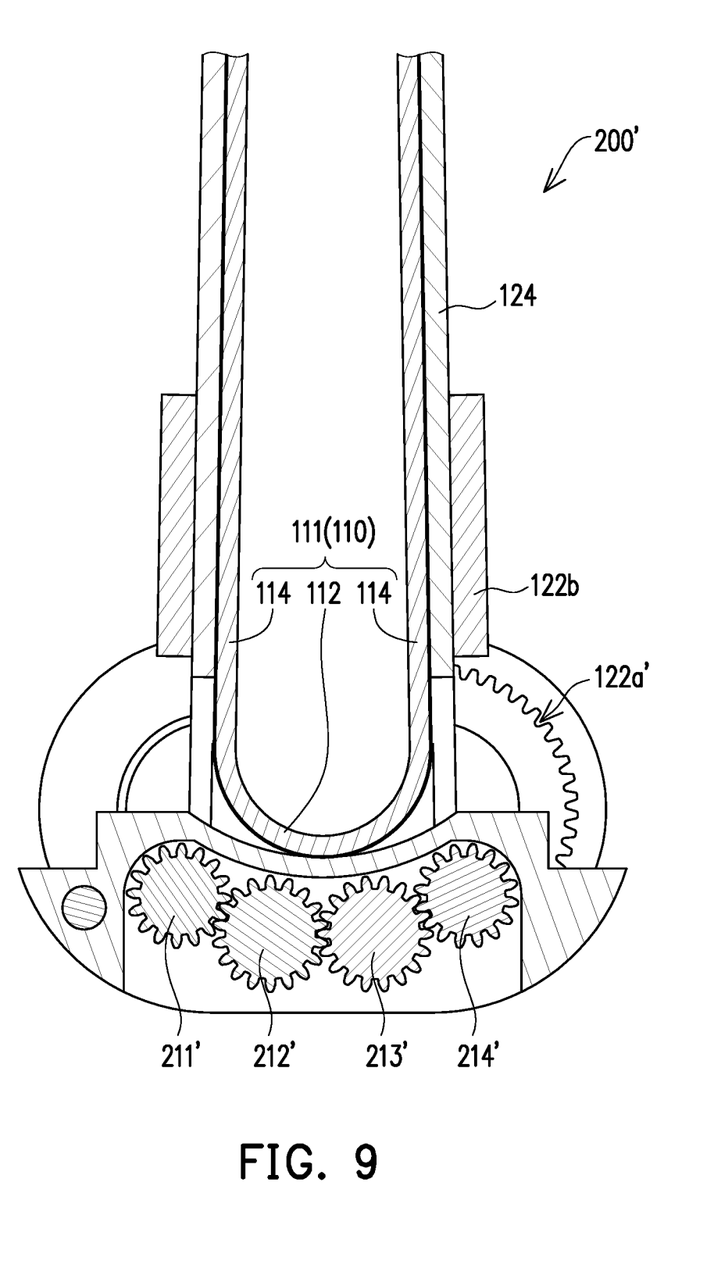
FIG. 9 is a schematic of another embodiment of a folding display device.

FIG. 9 is a schematic of another embodiment of a folding display device. Referring to FIG. 9, a folding display device 200' of the present embodiment is different from the folding display device 200 of the foregoing embodiment in that the rotating shafts 211, 212, 213, and 214 of the foregoing embodiment may be implemented by gears 211', 212', 213', and 214', and teeth may be further formed inside a curved groove portion 122a'. Therefore, via the engagement between the gears 211', 212', 213', and 214' with each other and with the teeth inside the curved groove portion 122a', the folding display device 200 may be changed between the flattened and bent states. Alternatively, the design may be changed as needed, and another gear (not shown) may be additionally provided in the curved groove portion 122a to be engaged with the gear 211' or 214'.

In the folding display device 200, the rotating shafts 211, 212, 213, and 214 are implemented by the gears 211', 212', 213', and 214', and via the engagement of the gears 211', 212', 213', and 214' with the teeth inside the curved groove portion 122a', the change of the folding display device 200 between the bent state and the flattened state is slower and smoother, and therefore sudden collapse caused by insufficient friction or material wear between the rotating shafts 211, 212, 213, and 214 and the curved groove portion 122a may be prevented, and therefore pulling the surface of the flexible screen 111 by the boards 124 due to a sudden change in the positions of the centers of rotation C may be prevented.

Based on the above, the bending module of the invention defines the centers of rotation in the neutral layer of the flexible unit, such that when the second portions of the flexible unit are rotated with respect to the first portion of the flexible unit via the respective corresponding center of rotation thereof, since the neutral layer is not stretched or compressed, when the bending module varies between the flattened state and the bent state, the length variation of the bending process of the bending module is minimal, and the endpoints of the supporting members connected to the flexible layer may be fixed at specific positions of the flexible unit without change. Therefore, the flexible unit is not damaged.

By applying the bending module in the folding display device, even if the folding display device is changed multiple times between the flattened state and the bent state, the appearance and functional integrity of the flexible screen may still be ensured to extend the service life of the folding display device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A bending module adapted to vary between a flattened state and a bent state, the bending module comprising:
    a flexible unit having a neutral layer; and
    a pair of supporting members correspondingly connected to the flexible unit,
    wherein the flexible unit is deformed when the bending module varies between the flattened state and the bent state, and the pair of supporting members are independently rotated corresponding to one of a pair of centers of rotation always maintained on the neutral layer of the flexible unit to be relatively close to or far from each other.

2. The bending module of claim 1, wherein the flexible unit has a first portion and two second portions located at two sides of the first portion, the pair of supporting members are correspondingly connected to the second portions, and the neutral layer is extended in the first portion and the second portions.

3. The bending module of claim 2, wherein positions of the pair of centers of rotation are intersections of each of an extended surface of the neutral layer of the second portions of the flexible unit when the bending module is bent and the extended surface of the neutral layer of the flexible unit when the bending module is flattened.

4. The bending module of claim 2, wherein when the bending module is in the flattened state, a distance of the pair of supporting members connected to two endpoints of the flexible unit is $\pi R$, wherein R is a bending diameter of the first portion.

5. A folding display device, comprising:
    a bending module comprising:
        a flexible unit having a neutral layer;
        a pair of supporting members correspondingly connected to the flexible unit; and
        a plurality of rotating shafts connected in pairs between the pair of supporting
    members, such that the pair of supporting members may be moved synchronously,
    wherein when the folding display device varies between a flattened state and a bent state, the flexible unit is deformed such that the pair of supporting members respectively correspond to one of a pair of centers of rotation always maintained on the neutral layer of the flexible unit to be rotated with respect to the rotating shafts to be relatively close to or far from each other.

6. The folding display device of claim 5, wherein the flexible unit is a flexible screen.

7. The folding display device of claim 5, wherein the flexible unit has a first portion and two second portions located at two sides of the first portion, the pair of supporting members are correspondingly connected to the second portions, and the neutral layer is extended in the first portion and the second portions.

8. The folding display device of claim 7, wherein each of the supporting members comprises:
    a connecting block having a curved groove portion and a connecting portion, wherein the curved groove portion is used to accommodate the rotating shafts; and
    a board, wherein the second portions of the flexible screen and the connecting portion of the connecting block are attached to two opposite sides of the board.

9. The folding display device of claim 8, wherein the rotating shafts are gears, teeth are provided inside the curved groove portion, and two of the gears located at opposite outer sides are engaged with the teeth inside the curved groove portion.

10. The folding display device of claim 8, wherein when the folding display device is in the flattened state, a distance of the boards connected to two endpoints of the flexible unit is $\pi R$, wherein R is a bending diameter of the first portion.

11. The folding display device of claim 7, wherein positions of the pair of centers of rotation are intersections of each of an extended surface of the neutral layer of the second portions of the flexible unit when the bending module is bent and an extended surface of the neutral layer of the flexible unit when the bending module is flattened.

12. The folding display device of claim 8, further comprising a housing that shields at least the rotating shafts and the first portion, wherein the supporting members are rotatable with respect to the housing.

* * * * *